United States Patent
Takigawa

(10) Patent No.: US 11,018,650 B2
(45) Date of Patent: May 25, 2021

(54) ACOUSTIC WAVE DEVICE

(71) Applicant: Murata Manufacturing Co., Ltd., Nagaokakyo (JP)

(72) Inventor: Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 50 days.

(21) Appl. No.: 16/443,901

(22) Filed: Jun. 18, 2019

(65) Prior Publication Data

US 2019/0305747 A1    Oct. 3, 2019

Related U.S. Application Data

(63) Continuation of application No. PCT/JP2017/046171, filed on Dec. 22, 2017.

(30) Foreign Application Priority Data

Dec. 26, 2016  (JP) .............................. JP2016-250663

(51) Int. Cl.
*H03H 9/02*    (2006.01)
*H03H 9/145*    (2006.01)
(Continued)

(52) U.S. Cl.
CPC .......... *H03H 9/02637* (2013.01); *H03H 3/08* (2013.01); *H03H 9/02559* (2013.01);
(Continued)

(58) Field of Classification Search
CPC ...... H03H 9/02637; H03H 9/145; H03H 3/08; H03H 9/02559; H03H 9/02842;
(Continued)

(56) References Cited

U.S. PATENT DOCUMENTS 7,939,989 B2 *   5/2011  Solal ................. H03H 9/1452
                                                      310/313 B
2011/0068655 A1  3/2011  Solal et al.
2013/0051588 A1  2/2013  Ruile et al.

FOREIGN PATENT DOCUMENTS

JP    60-184319 U    12/1985
JP    61-199927 U    12/1986
(Continued)

OTHER PUBLICATIONS

Official Communication issued in International Patent Application No. PCT/JP2017/046171 dated Mar. 20, 2018.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave device includes a piezoelectric substrate, an interdigital transducer electrode on the piezoelectric substrate, and two reflectors on both sides of the interdigital transducer electrode in an acoustic wave propagation direction. The reflectors include first and second busbars and first to third electrode fingers, respectively, and the first and second busbars are opposed to one another. The first busbars and the second busbars are connected by at least one third electrode finger. The reflectors each include a center area located centrally in a length direction and a first high-acoustic-velocity area that is located between the center area and the first busbars and has an acoustic velocity higher than the acoustic velocity of the center area, where the length direction is a direction in which the first to third electrode fingers extend.

19 Claims, 5 Drawing Sheets

(51) Int. Cl.
*H03H 3/08* (2006.01)
*H03H 9/205* (2006.01)
*H03H 9/64* (2006.01)
*H03H 9/72* (2006.01)

(52) U.S. Cl.
CPC .... *H03H 9/02842* (2013.01); *H03H 9/02992* (2013.01); *H03H 9/145* (2013.01); *H03H 9/14541* (2013.01); *H03H 9/205* (2013.01); *H03H 9/6483* (2013.01); *H03H 9/725* (2013.01)

(58) Field of Classification Search
CPC ........... H03H 9/02992; H03H 9/14541; H03H 9/205; H03H 9/6483; H03H 9/725; H03H 9/1457; H03H 9/02858; H03H 9/02881
USPC .......................................... 333/133, 193–196
See application file for complete search history.

(56) References Cited

FOREIGN PATENT DOCUMENTS

| | | |
|---|---|---|
| JP | 62-142409 A | 6/1987 |
| JP | 63-211910 A | 9/1988 |
| JP | 2000-022491 A | 1/2000 |
| JP | 2000-031780 A | 1/2000 |
| JP | 2000-312126 A | 11/2000 |
| JP | 2000-323957 A | 11/2000 |
| JP | 2001-267880 A | 9/2001 |
| JP | 2001-308676 A | 11/2001 |
| JP | 2012-186808 A | 9/2012 |
| JP | 2013-518455 A | 5/2013 |

\* cited by examiner

ACOUSTIC WAVE DEVICE

CROSS REFERENCE TO RELATED APPLICATIONS

This application claims the benefit of priority to Japanese Patent Application No. 2016-250663 filed on Dec. 26, 2016 and is a Continuation Application of PCT Application No. PCT/JP2017/046171 filed on Dec. 22, 2017. The entire contents of each application are hereby incorporated herein by reference.

BACKGROUND OF THE INVENTION

1. Field of the Invention

The present invention relates to acoustic wave devices.

2. Description of the Related Art

In general, acoustic wave devices are widely used in filters of cellular phones and the like. Japanese Unexamined Patent Application Publication No. 2000-312126 discloses an example of an acoustic wave device. The acoustic wave device described in Japanese Unexamined Patent Application Publication No. 2000-312126 includes a piezoelectric substrate and an interdigital transducer electrode formed on the piezoelectric substrate. A reflector is formed on both sides of the interdigital transducer electrode in an acoustic wave propagation direction. The reflector includes two busbars opposed to each other and a plurality of electrode fingers connected to the two busbars.

In the reflector of the acoustic wave device described in Japanese Unexamined Patent Application Publication No. 2000-312126, because all of the electrode fingers are connected to the busbars opposed to each other, the acoustic velocity decreases near the busbar, and in some cases transverse-mode spurious emissions are generated. Therefore, filter characteristics, such as insertion loss and the like, are degraded.

SUMMARY OF THE INVENTION

Preferred embodiments of the present invention provide acoustic wave devices each of which enables the reduction or prevention of the transverse-mode spurious emissions.

An acoustic wave device according to a preferred embodiment of the present invention includes a piezoelectric substrate, an interdigital transducer electrode provided on the piezoelectric substrate, and two reflectors provided on the piezoelectric substrate, the two reflectors being on both sides of the interdigital transducer electrode in an acoustic wave propagation direction, wherein each of the reflectors includes a first busbar, a second busbar, and a plurality of electrode fingers, the first busbar and the second busbar being opposed to one another, the plurality of electrode fingers each being connected to at least one of the first busbar and the second busbar, the first busbar and the second busbar are connected by at least one of the plurality of electrode fingers, each of the reflectors includes a center area centrally located in a length direction and a first outer side area located between the center area and the first busbar, where the length direction is a direction in which the plurality of electrode fingers extend, and the first outer side area is a first high-acoustic-velocity area having an acoustic velocity that is higher than an acoustic velocity of the center area.

In an acoustic wave device according to a preferred embodiment of the present invention, the first high-acoustic-velocity area is defined by, in the first outer side area, a gap between the first busbar and at least one of the plurality of electrode fingers, the at least one of the plurality of electrode fingers being different from the electrode finger connected to the first busbar and the second busbar.

In an acoustic wave device according to a preferred embodiment of the present invention, a width of the at least one of the plurality of electrode fingers connected to the first busbar and the second busbar is wider than a width of the electrode finger connected to the first busbar or the second busbar, where the widths are dimensions of the plurality of electrode fingers in the acoustic wave propagation direction. In this case, the at least one electrode finger connecting the first busbar and the second busbar is difficult to break. This ensures that the first busbar, the second busbar, and the plurality of electrode fingers are at the same potential. Accordingly, this further ensures that filter characteristics of the acoustic wave device are not degraded.

In an acoustic wave device according to a preferred embodiment of the present invention, the first busbar and the second busbar are connected by the electrode finger located at one end portion of the reflector in the acoustic wave propagation direction, and, in the first outer side area, gaps are provided between the first busbar and all of the plurality of electrode fingers other than the electrode finger located at the one end portion of the reflector, and all of the plurality of electrode fingers are connected to the second busbar.

In an acoustic wave device according to a preferred embodiment of the present invention, the first high-acoustic-velocity area has, in the at least one of the plurality of electrode fingers connected to the first busbar and the second busbar, a narrower width in the first outer side area than in the center area, where the widths are dimensions of the plurality of electrode fingers in the acoustic wave propagation direction.

In an acoustic wave device according to a preferred embodiment of the present invention, the reflector includes a second outer side area located between the center area and the second busbar, and the second outer side area is a second high-acoustic-velocity area whose acoustic velocity is higher than the acoustic velocity of the center area. In this case, the transverse-mode spurious emissions are able to be further reduced or prevented.

In an acoustic wave device according to a preferred embodiment of the present invention, the second high-acoustic-velocity area is defined by, in the second outer side area, a gap between the second busbar and at least one of the plurality of electrode fingers, the at least one of the plurality of electrode fingers being different from the electrode finger connected to the first busbar and the second busbar.

In an acoustic wave device according to a preferred embodiment of the present invention, the first busbar and the second busbar are connected by one of the plurality of electrode fingers, and the plurality of electrode fingers other than the one of the plurality of electrode fingers are each connected to the first busbar or the second busbar. In this case, in the process of forming the reflector by lift-off method, the resist is able to be easily removed. Accordingly, a formation defect in the reflector is unlikely to occur.

In an acoustic wave device according to a preferred embodiment of the present invention, the first busbar and the second busbar are connected by the electrode finger located at one end portion of the reflector in the acoustic wave propagation direction. In this case, a formation defect in the reflector is unlikely to occur.

In an acoustic wave device according to a preferred embodiment of the present invention, the first busbar and the second busbar are connected by the electrode fingers located at both end portions of the reflector in the acoustic wave propagation direction, the plurality of electrode fingers other than the electrode fingers located at both end portions of the reflector are each connected to the first busbar or the second busbar, and the first busbar is divided into a portion on one side and a portion on another side in the acoustic wave propagation direction. In this case, a formation defect in the reflector is unlikely to occur.

In an acoustic wave device according to a preferred embodiment of the present invention, the second high-acoustic-velocity area has, in the at least one of the plurality of electrode fingers connected to the first busbar and the second busbar, a narrower width in the second outer side area than in the center area, where the widths are dimensions of the plurality of electrode fingers in the acoustic wave propagation direction.

According to preferred embodiments of the present invention, acoustic wave devices that each enable the reduction or prevention of the transverse-mode spurious emissions are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings.

Each preferred embodiment described in the present specification is for illustrative purposes only and elements of different preferred embodiments may be partially exchanged or combined.

Figure 1:
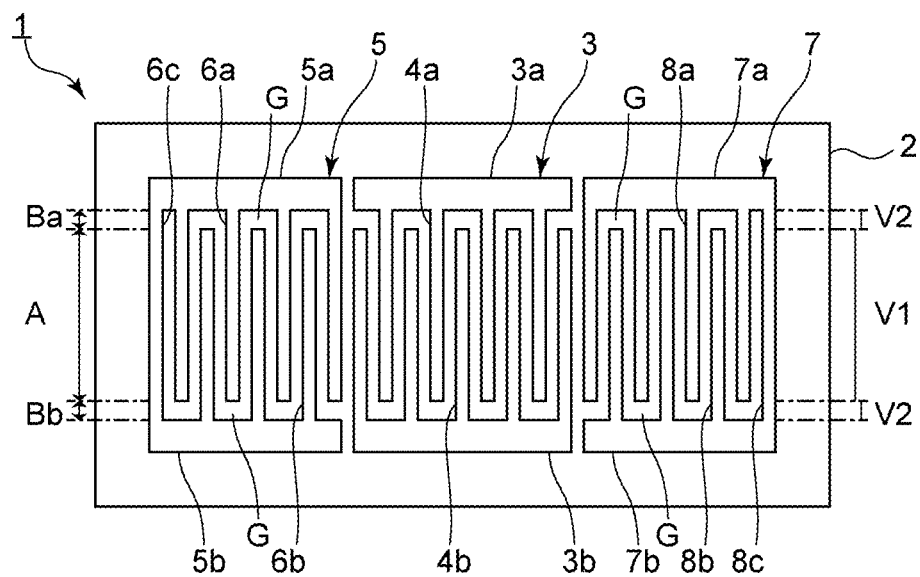
FIG. 1 is a schematic plan view of an acoustic wave device according to a first preferred embodiment of the present invention.

FIG. 1 is a schematic plan view of an acoustic wave device according to a first preferred embodiment of the present invention.

An acoustic wave device 1 includes a piezoelectric substrate 2. The piezoelectric substrate 2 is preferably made of, for example, $LiNbO_3$. Alternatively, the piezoelectric substrate 2 may be made of piezoelectric single crystal other than $LiNbO_3$, such as $LiTaO_3$ or other suitable material, or may be made of appropriate piezoelectric ceramics. Further, a piezoelectric substrate in which a piezoelectric film is provided on a support substrate may also be used. As the piezoelectric film, the above-described piezoelectric single crystal or other suitable material may be used, if appropriate.

An interdigital transducer electrode 3 is provided on the piezoelectric substrate 2. The interdigital transducer electrode 3 includes a first busbar 3a and a second busbar 3b, which are opposed to each other. The interdigital transducer electrode 3 includes a plurality of first electrode fingers 4a each connected to the first busbar 3a at one end portion and a plurality of second electrode fingers 4b each connected to the second busbar 3b at one end portion. The plurality of first electrode fingers 4a and the plurality of second electrode fingers 4b are interdigitated with each other. The interdigital transducer electrode 3 includes an intersecting area in which the first electrode finger 4a and the second electrode finger 4b overlap when viewed in an acoustic wave propagation direction. Upon applying an alternating-current voltage to the interdigital transducer electrode 3, an acoustic wave is excited.

The acoustic wave device 1 includes two reflectors 5 and 7 provided on the piezoelectric substrate 2, the reflectors 5 and 7 being on both sides of the interdigital transducer electrode 3 in the acoustic wave propagation direction. The acoustic wave device 1 of the present preferred embodiment is preferably a one-port acoustic wave resonator, for example.

The reflector 5 includes a first busbar 5a and a second busbar 5b, which are opposed to each other. The reflector 5 includes a plurality of first electrode fingers 6a each connected to the first busbar 5a at one end portion and a plurality of second electrode fingers 6b each connected to the second busbar 5b at one end portion. Gaps G are provided between the first electrode finger 6a and the second busbar 5b and between the second electrode finger 6b and the first busbar 5a. In the present preferred embodiment, the plurality of first electrode fingers 6a and the plurality of second electrode fingers 6b are interdigitated with each other.

The reflector 5 includes a third electrode finger 6c connecting the first busbar 5a and the second busbar 5b. This enables the first busbar 5a and the second busbar 5b and the first to third electrode fingers 6a to 6c of the reflector 5 to be at the same potential. Therefore, a standing wave is suitably excited. Accordingly, the filter characteristics of the acoustic wave device 1, such as insertion loss and the like, is unlikely to degrade.

In the present preferred embodiment, the reflector 5 includes one third electrode finger 6c. Alternatively, the reflector 5 may include a plurality of the third electrode fingers 6c. Here, the dimensions of the first to third electrode fingers 6a to 6c in the acoustic wave propagation direction are defined as widths of the first to third electrode fingers 6a to 6c. In the present preferred embodiment, the widths of the first to third electrode fingers 6a to 6c are preferably the same or substantially the same. Alternatively, the widths of the first to third electrode fingers 6a to 6c may be different from each other.

A direction in which the first to third electrode fingers 6a to 6c extend is defined as a length direction of the reflector 5. The reflector 5 includes a center area A centrally located in the length direction. In the present preferred embodiment, the center area A in the reflector 5 corresponds to the intersecting area in the interdigital transducer electrode 3. The reflector 5 includes a first outer side area Ba located between the center area A and the first busbar 5a. Similarly, the reflector 5 includes a second outer side area Bb located between the center area A and the second busbar 5b.

The gaps G between the plurality of second electrode fingers 6b and the first busbar 5a are located in the first outer side area Ba. Accordingly, in the reflector 5, portions located in the first outer side area Ba are only portions of the first electrode fingers 6a. Similarly, the gaps G between the plurality of first electrode fingers 6a and the second busbar 5b are located in the second outer side area Bb. Accordingly, in the reflector 5, portions located in the second outer side area Bb are only portions of the second electrode fingers 6b. This causes the acoustic velocity of acoustic wave in the first outer side area Ba and the second outer side area Bb to be higher than the acoustic velocity of acoustic wave in the center area A. In this case, V2>V1, where the acoustic velocity in the center area A is V1, and the acoustic velocity in the first outer side area Ba and the second outer side area Bb is V2. Thus, the first outer side area Ba and the second outer side area Bb are a first high-acoustic-velocity area and a second high-acoustic-velocity area, whose acoustic velocity is higher than that of the center area A.

The reflector 7 has a configuration that is the same as or similar to that of the reflector 5. The reflector 7 includes a first busbar 7a, a second busbar 7b, and first to third electrode fingers 8a to 8c. The reflector 7 includes the center area A and the first outer side area Ba and the second outer side area Bb. By providing the gaps G between the second electrode fingers 8b and the first busbar 7a, the first high-acoustic-velocity area is provided. By providing the gaps G between the first electrode fingers 8a and the second busbar 7b, the second high-acoustic-velocity area is provided. Accordingly, also in the reflector 7, the first outer side area Ba and the second outer side area Bb are the first high-acoustic-velocity area and the second high-acoustic-velocity area, whose acoustic velocity is higher than that of the center area A.

A relationship between the acoustic velocities V1 and V2 such as the above is illustrated in FIG. 1. In FIG. 1, the closer to the right-hand side of FIG. 1, the higher the acoustic velocity becomes.

Further, as with each of the reflectors 5 and 7, the interdigital transducer electrode 3 also includes the first high-acoustic-velocity area and the second high-acoustic-velocity area between the intersecting area and the first busbar 3a and between the intersecting area and the second busbar 3b, respectively. In the interdigital transducer electrode 3, the acoustic velocity of the first high-acoustic-velocity area and the second high-acoustic-velocity area is higher than the acoustic velocity of the intersecting area. In the acoustic wave device 1, the first high-acoustic-velocity areas of the reflector 5, the interdigital transducer electrode 3, and the reflector 7 are connected along the acoustic wave propagation direction. The second high-acoustic-velocity areas of the reflector 5, the interdigital transducer electrode 3, and the reflector 7 are also connected along the acoustic wave propagation direction.

Here, a direction in which the first electrode finger 4a and the second electrode finger 4b extend is defined as the length direction in the interdigital transducer electrode 3. In the interdigital transducer electrode 3, the dimension of the intersecting area in the length direction is defined as an intersecting width. In each of the reflectors 5 and 7, the dimension of the center area A in the length direction is defined as the width of the center area A. It is assumed that X is a wavelength determined by an electrode finger pitch. Here, in the present preferred embodiment, preferably, the wavelength X of the interdigital transducer electrode 3 is preferably about 4 μm, the intersecting width is preferably about 17.5λ, the number of pairs of the electrode fingers is preferably 10 pairs, and the film thickness is preferably about 700 nm, for example. Preferably, the wavelength X of each of the reflectors 5 and 7 is about 4 μm, the width of the center area A is about 17.5λ, the number of pairs of the electrode fingers is 10 pairs, and the film thickness is about 700 nm, for example.

A characteristic feature of the present preferred embodiment is that each of the reflectors 5 and 7 includes the first high-acoustic-velocity area and the second high-acoustic-velocity area. Such feature reduces or prevents transverse-mode spurious emissions. This is explained in the following portion by comparing the present preferred embodiment with a first comparative example.

Note that the first comparative example is different from the present preferred embodiment in that the electrode fingers of each reflector are all connected to both of the first busbar and the second busbar.

Figure 2:
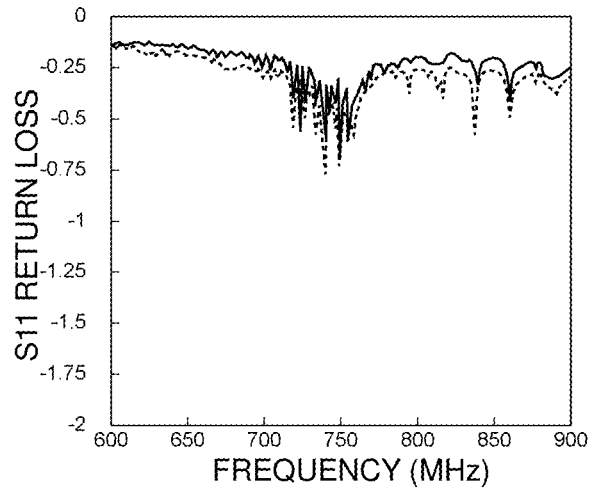
FIG. 2 is a diagram illustrating return losses of acoustic wave devices of the first preferred embodiment of the present invention and a first comparative example.

FIG. 2 is a diagram illustrating return losses of acoustic wave devices of the first preferred embodiment and the first comparative example. In FIG. 2, the solid line represents a result of the first preferred embodiment, and the dashed line represents a result of the first comparative example.

As illustrated in FIG. 2, the return loss is degraded in the first comparative example. In the first comparative example, the interdigital transducer electrode includes the first high-acoustic-velocity area and the second high-acoustic-velocity area, but each reflector does not include the first high-acoustic-velocity area or the second high-acoustic-velocity area. This causes a decrease in acoustic velocity when an acoustic wave propagates to an area near the first busbar of each reflector from the first high-acoustic-velocity area of the interdigital transducer electrode. As a result, a transverse-mode spurious emission occurs. Similarly, the acoustic velocity decreases when an acoustic wave propagates to an area near the second busbar of each reflector from the second high-acoustic-velocity area of the interdigital transducer electrode, thus generating transverse-mode spurious emissions. Therefore, the return loss is degraded in the first comparative example.

In contrast, in the first preferred embodiment, as illustrated in FIG. 1, each of the reflectors 5 and 7 includes the first high-acoustic-velocity area and the second high-acoustic-velocity area. Because of this, the acoustic velocity does not significantly decrease when an acoustic wave propagates to each of the reflectors 5 and 7 from the interdigital transducer electrode 3. Accordingly, the occurrence of transverse-mode spurious emissions is able to be reduced or prevented in each of the reflectors 5 and 7. As illustrated in FIG. 2, this improves the return loss.

Here, in a fabrication process of the acoustic wave device 1, the reflector 5 illustrated in FIG. 1 is formed, for example, by lift-off method. In the reflector 5, areas between the first to third electrode fingers 6a to 6c and respective gaps G are connected to each other, and the areas between the first to third electrode fingers 6a to 6c and the respective gaps G are connected with an area outside the reflector 5. Therefore, a resist for patterning the reflector 5 is also able to have a configuration in which respective portions are connected as with the above. Accordingly, in the process of forming the reflector 5, the resist is able to be easily removed. Similarly, in the process of forming the reflector 7, the resist is able to be easily removed. Accordingly, a formation defect in each of the reflectors 5 and 7 is unlikely to occur.

As in the first preferred embodiment, in the case in which the first high-acoustic-velocity area is defined by providing the gap G, the reflector 5 needs to include at least one second electrode finger 6b. It is preferable, however, that the reflector 5 includes a plurality of the second electrode fingers 6b. This enables an increase in the acoustic velocity in the first high-acoustic-velocity area. Because of this, the acoustic velocity is much less likely to decrease when an acoustic wave propagates to the reflector 5 from the interdigital transducer electrode 3. Accordingly, the transverse-mode spurious emissions are able to be further reduced or prevented.

In the case in which the second high-acoustic-velocity area is defined by providing the gap G, the reflector 5 needs to include at least one first electrode finger 6a. It is preferable, however, that the reflector 5 includes a plurality of the first electrode fingers 6a. Because of this, the acoustic velocity is much less likely to decrease when an acoustic wave propagates to the reflector 5 from the interdigital transducer electrode 3.

It is preferable that the reflector 5 includes one third electrode finger 6c and that the electrode fingers other than the third electrode finger 6c are each either the first electrode finger 6a or the second electrode finger 6b. This enables a further increase in the acoustic velocity in the first high-acoustic-velocity area or the second high-acoustic-velocity area. Accordingly, the acoustic velocity is much less likely to decrease when an acoustic wave propagates to the reflector 5 from the interdigital transducer electrode 3. In addition, as described above, a formation defect in the reflector 5 is unlikely to occur.

The third electrode finger 6c is preferably located at an end portion of the side opposite the interdigital transducer electrode 3 side in the acoustic wave propagation direction. This enables the first electrode finger 6a or the second electrode finger 6b to be disposed at an end portion of the interdigital transducer electrode 3 side. This enables an increase in the acoustic velocity on the interdigital transducer electrode 3 side in the reflector 5. Accordingly, the transverse-mode spurious emissions are able to be further reduced or prevented. Alternatively, the third electrode finger 6c may be located at an end portion of the interdigital transducer electrode 3 side of the reflector 5 in the acoustic wave propagation direction.

In first to third modified examples of the first preferred embodiment, which will be described below, the transverse-mode spurious emissions are also able to be reduced or prevented, and a formation defect in the reflector is unlikely to occur.

Figure 3:
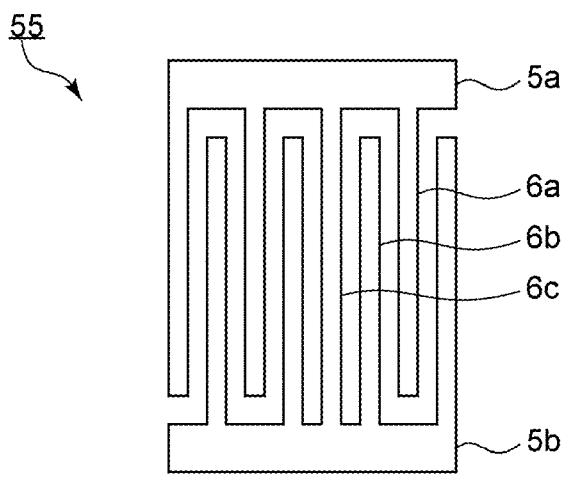
FIG. 3 is a schematic plan view of a reflector in a first modified example of the first preferred embodiment of the present invention.

In a first modified example of the first preferred embodiment illustrated in FIG. 3, the third electrode finger 6c is located near a center of a reflector 55 in the acoustic wave propagation direction. In this manner, in the case in which only one third electrode finger 6c is included, regardless of the location of the third electrode finger 6c, the areas between the first to third electrode fingers 6a to 6c and the respective gaps G are able to be connected with an area outside the reflector 55.

Figure 4:
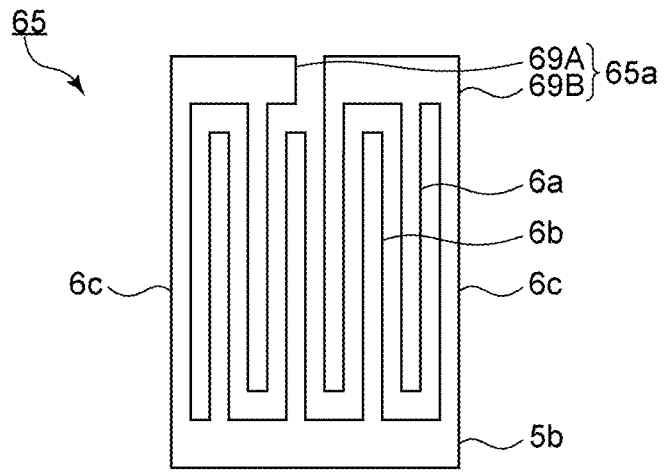
FIG. 4 is a schematic plan view of a reflector in a second modified example of the first preferred embodiment of the present invention.

In a second modified example of the first preferred embodiment illustrated in FIG. 4, the third electrode finger 6c is provided at both end portions of a reflector 65 in the acoustic wave propagation direction. A first busbar 65a is divided into a first portion 69A and a second portion 69B in the acoustic wave propagation direction. This allows the areas between first to third electrode fingers 6a to 6c and the respective gaps G to be connected with an area outside the reflector 65.

Figure 5:
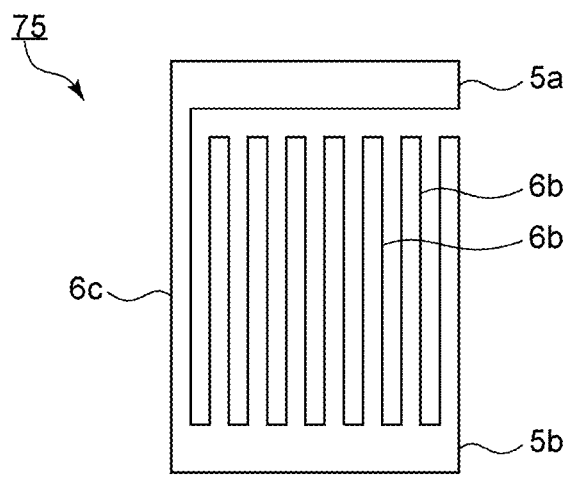
FIG. 5 is a schematic plan view of a reflector in a third modified example of the first preferred embodiment of the present invention.

In a third modified example of the first preferred embodiment illustrated in FIG. 5, a reflector 75 includes the first high-acoustic-velocity area and does not include the second high-acoustic-velocity area. Specifically, the reflector 75 includes one third electrode finger 6c. The third electrode finger 6c is located at an end portion of the side opposite the interdigital transducer electrode side in the acoustic wave propagation direction. All of the electrode fingers other than the third electrode finger 6c are the second electrode fingers 6b and are connected to the second busbar 5b. It is preferable, however, as with the first preferred embodiment, that the first high-acoustic-velocity area and the second high-acoustic-velocity area are included. This enables further reduction or prevention of the transverse-mode spurious emissions.

The reflector 7 may have the configuration different from that of the reflector 5. It is preferable, however, that the reflector 7 has a configuration the same as or similar to that of the reflector 5. This ensures the excitation of a standing wave. Accordingly, the filter characteristics of the acoustic wave device 1 is not likely to degrade.

Figure 6:
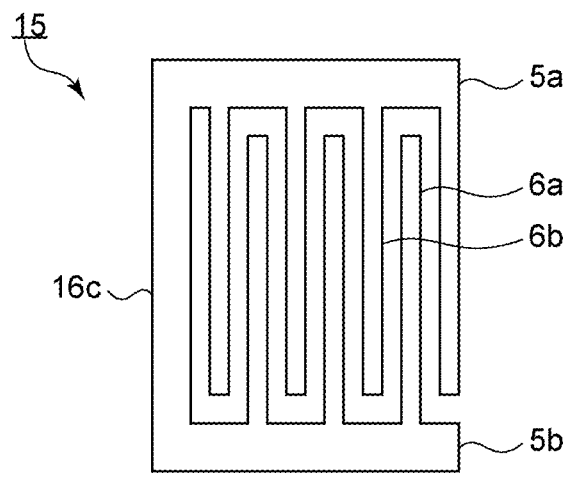
FIG. 6 is a schematic plan view of a reflector in a second preferred embodiment of the present invention.

FIG. 6 is a schematic plan view of a reflector in a second preferred embodiment of the present invention.

An acoustic wave device of the second preferred embodiment is different from that of the first preferred embodiment in that the width of a third electrode finger 16c of a reflector 15 is wider than the widths of the first electrode finger 6a and the second electrode finger 6b. With regard to points other than the above, the acoustic wave device of the second preferred embodiment has a configuration the same as or similar to that of the acoustic wave device 1 of the first preferred embodiment.

Because the third electrode finger 16c has a wider width, breaking of the third electrode finger 16c is unlikely to occur in the process of fabricating the acoustic wave device. This further ensures that the first busbar 5a and the second busbar 5b, the first electrode finger 6a and the second electrode finger 6b, and the third electrode finger 16c of the reflector 15 are at the same potential. Accordingly, this further ensures that the filter characteristics of the acoustic wave device is unlikely to degrade.

In addition, as with the first preferred embodiment, the transverse-mode spurious emissions are also able to be reduced or prevented, and a formation defect in the reflector 15 is unlikely to occur.

In the case in which a plurality of the third electrode fingers 16c are included, the width of at least one third electrode finger 16c is preferably wider than the widths of the first electrode fingers 6a and the second electrode fingers 6b. Because of this, the filter characteristics of the acoustic wave device is unlikely to degrade.

Figure 7:
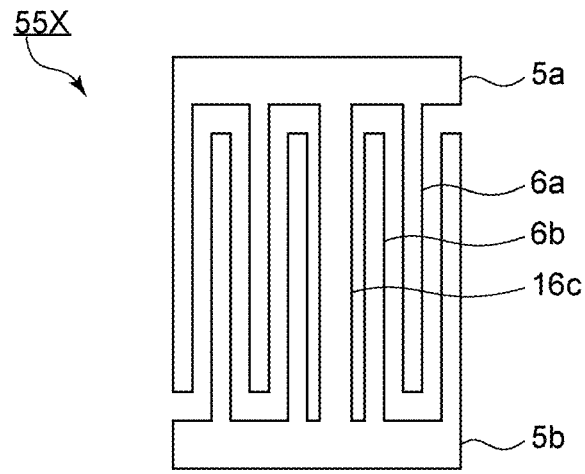
FIG. 7 is a schematic plan view of a reflector in a first modified example of the second preferred embodiment of the present invention.
Figure 8:
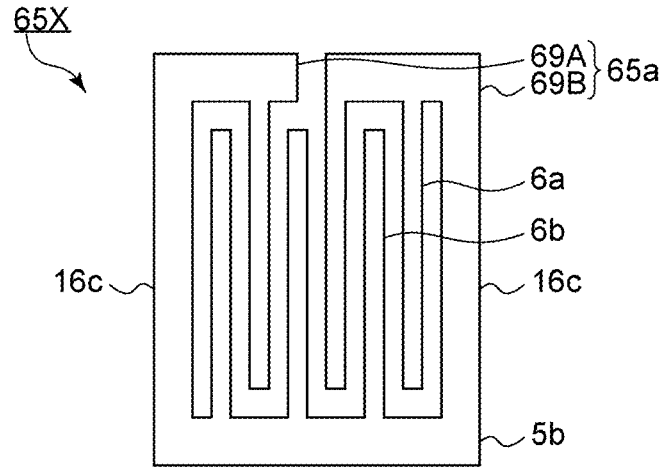
FIG. 8 is a schematic plan view of a reflector in a second modified example of the second preferred embodiment of the present invention.
Figure 9:
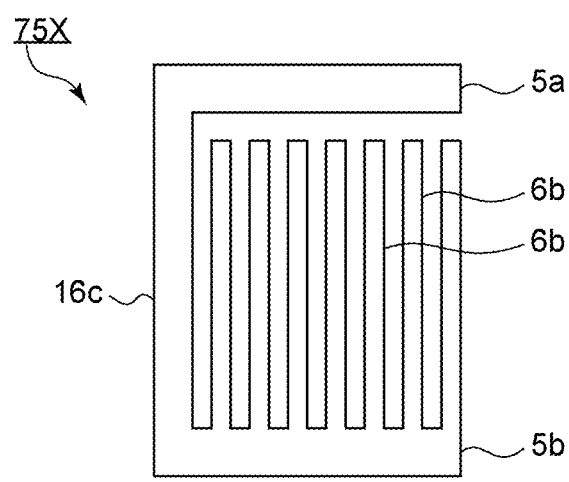
FIG. 9 is a schematic plan view of a reflector in a third modified example of the second preferred embodiment of the present invention.

Reflectors in first to third modified examples of the second preferred embodiment are illustrated in FIG. 7 to FIG. 9, respectively. Reflectors 55X, 65X, and 75X of the first to third modified examples of the second preferred embodiment correspond to reflectors in the first to third modified examples of the first preferred embodiment, whose third electrode finger has a wider width than the first electrode finger and the second electrode finger. Even in the reflectors 55X, 65X, and 75X, as with the second preferred embodiment, breaking of the third electrode finger 16c is unlikely to occur. This further ensures that the filter characteristics of the acoustic wave device is unlikely to degrade.

Figure 10:
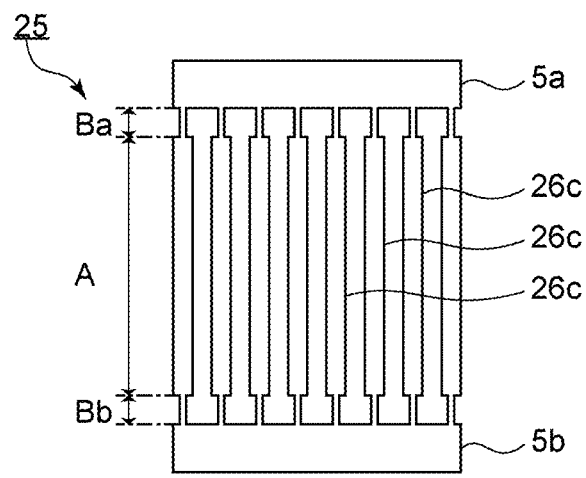
FIG. 10 is a schematic plan view of a reflector in a third preferred embodiment of the present invention.

FIG. 10 is a schematic plan view of a reflector in a third preferred embodiment of the present invention.

An acoustic wave device of the present preferred embodiment is different from the acoustic wave device 1 of the first preferred embodiment in that all of the electrode fingers of a reflector 25 are third electrode fingers 26c connecting the first busbar 5a and the second busbar 5b and that configurations of the first outer side area Ba and the second outer side area Bb are different from those of the first preferred embodiment. The remaining configuration of the acoustic wave device of the present preferred embodiment is the same as or similar to that of the acoustic wave device 1 of the first preferred embodiment.

In the reflector 25, all of the third electrode fingers 26c have a narrower width in the first outer side area Ba than in the center area A. This causes the acoustic velocity of the first outer side area Ba to be higher than the acoustic velocity of the center area A. Accordingly, the first outer side area Ba is the first high-acoustic-velocity area. Similarly, all of the third electrode fingers 26c have a narrower width in the second outer side area Bb than in the center area A. This causes the acoustic velocity of the second outer side area Bb to be higher than the acoustic velocity of the center area A. Accordingly, the second outer side area Bb is the second high-acoustic-velocity area.

Even in the present preferred embodiment, as with the first preferred embodiment, the transverse-mode spurious emissions are able to be reduced or prevented.

In the present preferred embodiment, no gap is provided between the first busbar 5a and the electrode finger. Even in such case, by having a narrower width in the first outer side area Ba than in the center area A in at least one third electrode finger 26c, the first high-acoustic-velocity area is provided. It is preferable, however, that a plurality of the third electrode fingers 26c have a narrower width in the first outer side area Ba than in the center area A. More preferably, as with the present preferred embodiment, all of the third electrode fingers 26c preferably have a narrower width in the first outer side area Ba than in the center area A. This enables a further increase in the acoustic velocity in the first high-acoustic-velocity area. The second outer side area Bb has a similar configuration.

Alternatively, the reflector 25 may include the second electrode finger so as to provide a gap between the second electrode finger and the first busbar 5a and the third electrode finger 26c having a narrower width in the first outer side area Ba. In this case, the first high-acoustic-velocity area is also provided in the first outer side area Ba. The reflector 25 may include the first electrode finger arranged so as to include a gap between the first electrode finger and the second busbar 5b and the third electrode finger 26c having a narrower width in the second outer side area Bb. In this case, the second high-acoustic-velocity area is also provided in the second outer side area Bb.

Figure 11:
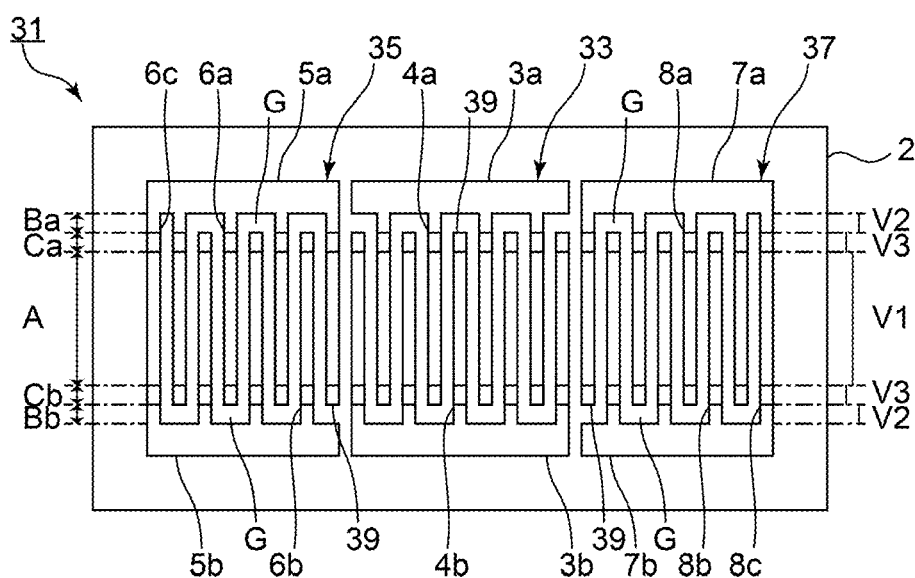
FIG. 11 is a schematic plan view of an acoustic wave device according to a fourth preferred embodiment of the present invention.

FIG. 11 is a schematic plan view of an acoustic wave device according to a fourth preferred embodiment of the present invention.

An acoustic wave device 31 is different from that of the first preferred embodiment in that mass addition films 39 are provided on the first electrode fingers 4a and the second electrode fingers 4b of an interdigital transducer electrode 33. Further, the acoustic wave device 31 is also different from that of the first preferred embodiment in that the mass addition films 39 are provided on the first to third electrode fingers 6a to 6c of a reflector 35 and the first to third electrode fingers 8a to 8c of a reflector 37. With regard to the configuration other than the above-described points, the acoustic wave device 31 of the present preferred embodiment has a configuration the same as or similar to that of the acoustic wave device 1 of the first preferred embodiment.

More specifically, the reflector 35 includes a first edge area Ca and a second edge area Cb. The first edge area Ca and the second edge area Cb are located on both sides of the center area A in the length direction. The first edge area Ca is located between the center area A and the first outer side area Ba, and the second edge area Cb is located between the center area A and the second outer side area Bb.

The mass addition films 39 are provided in the first edge area Ca and the second edge area Cb of the reflector 35. This lowers the acoustic velocities of acoustic wave in the first edge area Ca and the second edge area Cb. In this case, V1>V3, where V3 is the acoustic velocity in the first edge area Ca and the second edge area Cb. Thus, the first edge area Ca and the second edge area Cb are a first low-acoustic-velocity area and a second low-acoustic-velocity area, whose acoustic velocity is lower than that of the center area A.

In the present preferred embodiment, a relationship among the acoustic velocities is V2>V1>V3. This relationship is illustrated in FIG. 11.

Similarly, the interdigital transducer electrode 33 and the reflector 37 each also includes the first low-acoustic-velocity area and the second low-acoustic-velocity area. In the present preferred embodiment, the intersecting area of the interdigital transducer electrode 33 includes the center area located centrally in the length direction and the first edge area and the second edge area located on both sides of the center area in the length direction. The center area A in each of the reflectors 35 and 37 corresponds to the center area in the interdigital transducer electrode 33.

By providing the first low-acoustic-velocity area and the second low-acoustic-velocity area outside the center area and providing the first high-acoustic-velocity area and the second high-acoustic-velocity area outside the first low-acoustic-velocity area and the second low-acoustic-velocity area in the interdigital transducer electrode 33, unwanted waves are able to be reduced or prevented. In this manner, the acoustic wave device 31 utilizes a piston mode.

In the acoustic wave device 31, the first low-acoustic-velocity areas of the reflector 35, the interdigital transducer electrode 33, and the reflector 37 are connected along the acoustic wave propagation direction. Similarly, the second low-acoustic-velocity areas, the center areas, the first high-acoustic-velocity areas, and second high-acoustic-velocity areas of the reflector 35, the interdigital transducer electrode 33, and the reflector 37 are also respectively connected along the acoustic wave propagation direction. Because of this, the acoustic velocity of an acoustic wave propagated to the reflector 35, 37 from the interdigital transducer electrode is unlikely to change. Accordingly, even in the present preferred embodiment, as with the first preferred embodiment, the transverse-mode spurious emissions are able to be reduced or prevented.

In the first to fourth preferred embodiments and their modified examples, the example is described in which the acoustic wave device is a one-port type acoustic wave resonator. Acoustic wave devices according to the present invention may also be, for example, a longitudinally coupled resonator-type acoustic wave filter, a ladder filter, and a duplexer. In the following portion, an example is described, in which an acoustic wave device is a duplexer.

Figure 12:
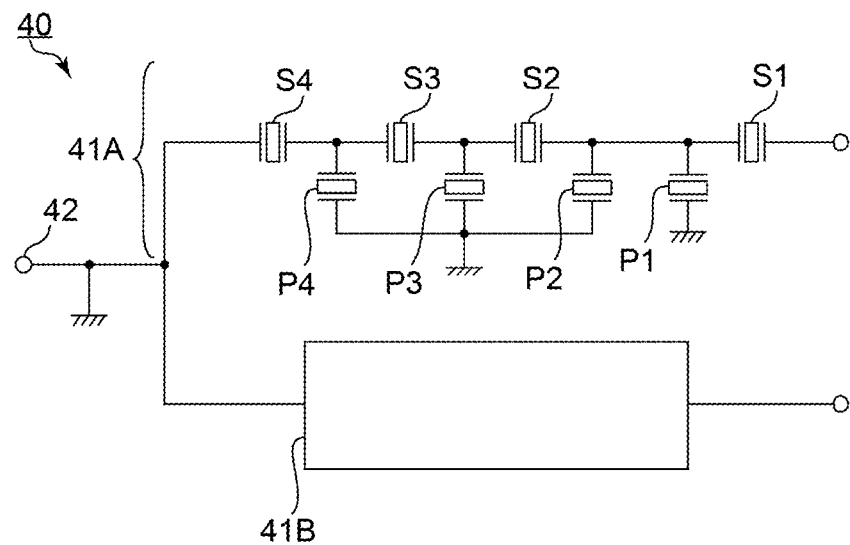
FIG. 12 is a schematic circuit diagram of an acoustic wave device according to a fifth preferred embodiment of the present invention.

FIG. 12 is a schematic circuit diagram of an acoustic wave device according to a fifth preferred embodiment of the present invention.

hand, the configuration of the receiving filter 41B illustrated in the block diagram is not particularly limited.

In the present preferred embodiment, the series arm resonators S1 to S4 and the parallel arm resonators P1 to P4 are preferably all acoustic wave resonators having a configuration similar to that of the first preferred embodiment. This enables effective reduction or prevention of the transverse-mode spurious emissions. Note that, of the series arm resonators S1 to S4 and the parallel arm resonators P1 to P4, at least one resonator needs to be an acoustic wave resonator configured according to a preferred embodiment of the present invention.

Design parameters of the series arm resonators S1 to S4 and the parallel arm resonators P1 to P4 vary depending on desired filter characteristics. More specifically, the design parameters of respective acoustic wave resonators of the transmitting filter 41A are preferably set, for example, as in the following Table 1.

TABLE 1

|  |  | Series arm resonator S1 | Series arm resonator S2 | Series arm resonator S3 | Series arm resonator S4 | Parallel arm resonator P1 | Parallel arm resonator P2 | Parallel arm resonator P3 | Parallel arm resonator P4 |
| --- | --- | --- | --- | --- | --- | --- | --- | --- | --- |
| IDT Electrode | Wavelength ($\mu$m) | 3.97 | 4.04 | 4.03 | 4.04 | 4.23 | 4.22 | 4.23 | 3.58 |
|  | Intersecting width ($\lambda$) | 82.70 | 83.58 | 79.59 | 97.12 | 90.72 | 87.87 | 167.16 | 89.24 |
|  | Number of pairs of electrode fingers (pairs) | 61 | 58 | 63 | 77 | 108 | 99 | 66 | 18 |
|  | Film thickness (nm) | 700 | 700 | 700 | 700 | 700 | 700 | 700 | 700 |
| Reflector | Wavelength ($\mu$m) | 4.21 | 4.22 | 4.29 | 4.31 | 4.23 | 4.22 | 4.23 | 3.58 |
|  | Intersecting width ($\lambda$) | 82.70 | 83.58 | 79.59 | 97.12 | 90.72 | 87.87 | 167.16 | 89.24 |
|  | Number of pairs of electrode fingers (pairs) | 4 | 5.5 | 4.5 | 4.5 | 4.5 | 4.5 | 4.5 | 5 |
|  | Film thickness (nm) | 700 | 700 | 700 | 700 | 700 | 700 | 700 | 700 |

An acoustic wave device 40 is a duplexer including a transmitting filter 41A and a receiving filter 41B whose pass band is different from that of the transmitting filter 41A. The acoustic wave device 40 includes an antenna terminal 42 to be connected to an antenna. The transmitting filter 41A and the receiving filter 41B are connected in common to the antenna terminal 42.

The transmitting filter 41A includes series arm resonators S1 to S4 and parallel arm resonators P1 to P4. The transmitting filter 41A is preferably, for example, a ladder filter as an acoustic wave device according to a preferred embodiment of the present invention. More specifically, the parallel arm resonator P1 is connected between the ground potential and a connection point between the series arm resonator S1 and the series arm resonator S2. End portions of the parallel arm resonators P2 to P4 are connected to a connection point between the series arm resonator S1 and the series arm resonator S2, a connection point between the series arm resonator S2 and the series arm resonator S3, and a connection point between the series arm resonator S3 and the series arm resonator S4, respectively, and the other end portions of the parallel arm resonators P2 to P4 are connected in common and connected to the ground potential. On the other In the present preferred embodiment, the transmitting filter 41A is an acoustic wave device according to a preferred embodiment of the present invention. However, at least one of the transmitting filter 41A and the receiving filter 41B may be an acoustic wave device configured according to a preferred embodiment the present invention.

In the following portion, advantageous effects of the present preferred embodiment are described by comparing the present preferred embodiment with a second comparative example.

Note that, in the second comparative example, in all of the reflectors of all of the acoustic wave resonators, all of the electrode fingers connect the first busbar and the second busbar. All of the reflectors do not include the first high-acoustic-velocity area or the second high-acoustic-velocity area. In these aspects, the second comparative example is different from the fifth preferred embodiment.

Figure 13:
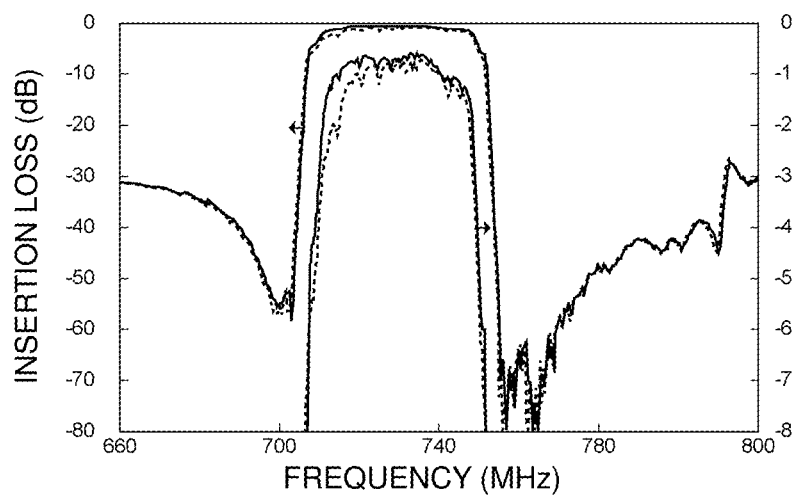
FIG. 13 is a diagram illustrating attenuation frequency characteristics of transmitting filters in the fifth preferred embodiment of the present invention and a second comparative example.

FIG. 13 is a diagram illustrating attenuation frequency characteristics of the transmitting filters in the fifth preferred embodiment and the second comparative example. In FIG. 13, the solid line represents a result of the fifth preferred embodiment, and the dashed line represents a result of the second comparative example.

As illustrated in FIG. 13, it is seen that the insertion loss is degraded in the second comparative example. In the second comparative example, transverse-mode spurious emissions easily occur in the reflector of each acoustic wave resonator. Therefore, as illustrated in FIG. 13, it is seen that ripples due to the transverse-mode spurious emissions are larger.

In contrast, in the fifth preferred embodiment, the reflector in each acoustic wave resonator has the configuration the same as or similar to that of the first preferred embodiment. Thus, the transverse-mode spurious emissions are able to be effectively reduced or prevented. This enables the reduction of the ripples due to the transverse-mode spurious emissions. Further, this enables the reduction of the insertion loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
a piezoelectric substrate;
an interdigital transducer electrode provided on the piezoelectric substrate; and
two reflectors provided on the piezoelectric substrate, the two reflectors being disposed on both sides of the interdigital transducer electrode in an acoustic wave propagation direction; wherein
each of the two reflectors includes a first busbar, a second busbar, and a plurality of electrode fingers, the first busbar and the second busbar being opposed to one another, the plurality of electrode fingers each being connected to at least one of the first busbar and the second busbar;
the first busbar and the second busbar are connected by at least one of the plurality of electrode fingers;
the at least one of the plurality of electrode fingers includes at least one single electrode finger that extends from the first busbar to the second busbar;
each of the two reflectors includes a center area located centrally in a length direction and a first outer side area located between the center area and the first busbar, where the length direction is a direction in which the plurality of electrode fingers extend; and
the first outer side area is a first high-acoustic-velocity area with an acoustic velocity higher than an acoustic velocity of the center area.

2. The acoustic wave device according to claim 1, wherein the first high-acoustic-velocity area is defined by, in the first outer side area, a gap between the first busbar and at least one of the plurality of electrode fingers, the at least one of the plurality of electrode fingers being different from the at least one of the plurality of electrode fingers connected to the first busbar and the second busbar.

3. The acoustic wave device according to claim 2, wherein a width of the at least one of the plurality of electrode fingers connected to the first busbar and the second busbar is wider than a width of the plurality of electrode fingers connected to the first busbar or the second busbar, where the widths are dimensions of the plurality of electrode fingers in the acoustic wave propagation direction.

4. The acoustic wave device according to claim 3, wherein the at least one of the plurality of electrode fingers connected to the first busbar and the second busbar is located at one end portion of the reflector in the acoustic wave propagation direction, and, in the first outer side area, gaps are provided between the first busbar and all of the plurality of electrode fingers other than the at least one of the plurality of electrode fingers located at the one end portion of the reflector; and
all of the plurality of electrode fingers are connected to the second busbar.

5. The acoustic wave device according to claim 2, wherein the at least one of the plurality of electrode fingers connected to the first busbar and the second busbar is located at one end portion of the reflector in the acoustic wave propagation direction, and, in the first outer side area, gaps are provided between the first busbar and all of the plurality of electrode fingers other than the at least one of the plurality of electrode fingers located at the one end portion of the reflector; and
all of the plurality of electrode fingers are connected to the second busbar.

6. The acoustic wave device according to claim 1, wherein the first high-acoustic-velocity area has, in the at least one of the plurality of electrode fingers connected to the first busbar and the second busbar, a narrower width in the first outer side area than in the center area, where the widths are dimensions of the plurality of electrode fingers in the acoustic wave propagation direction.

7. The acoustic wave device according to claim 1, wherein the reflector includes a second outer side area located between the center area and the second busbar; and
the second outer side area is a second high-acoustic-velocity area whose acoustic velocity is higher than the acoustic velocity of the center area.

8. The acoustic wave device according to claim 7, wherein the second high-acoustic-velocity area is defined by, in the second outer side area, a gap between the second busbar and at least one of the plurality of electrode fingers, the at least one of the plurality of electrode fingers being different from the at least one of the plurality of electrode finger connected to the first busbar and the second busbar.

9. The acoustic wave device according to claim 8, wherein the first busbar and the second busbar are connected by one of the plurality of electrode fingers, and the plurality of electrode fingers other than the one of the plurality of electrode fingers are each connected to the first busbar or the second busbar.

10. The acoustic wave device according to claim 9, wherein the one of the plurality of electrode fingers connected to the first busbar and the second busbar is located at one end portion of the reflector in the acoustic wave propagation direction.

11. The acoustic wave device according to claim 8, wherein
the first busbar and the second busbar are connected by electrode fingers of the plurality of electrode fingers located at both end portions of the reflector in the acoustic wave propagation direction;
the plurality of electrode fingers other than the electrode fingers located at both end portions of the reflector are each connected to the first busbar or the second busbar; and
the first busbar is divided into a portion on one side and a portion on another side in the acoustic wave propagation direction.

12. The acoustic wave device according to claim 7, wherein the second high-acoustic-velocity area has, in the at least one of the plurality of electrode fingers connected to the first busbar and the second busbar, a narrower width in the second outer side area than in the center area, where the widths are dimensions of the plurality of electrode fingers in the acoustic wave propagation direction.

13. The acoustic wave device according to claim 1, wherein the piezoelectric substrate is made of $LiNbO_3$.

14. The acoustic wave device according to claim 1, wherein the interdigital transducer electrode includes:
    third and fourth busbars opposed to each other;
    a plurality of first electrode fingers connected to the third busbar at one end portion thereof;
    a plurality of second electrode fingers connected to the fourth busbar at one end thereof; and
    the plurality of first electrode fingers and the plurality of second electrode fingers are interdigitated with each other.

15. The acoustic wave device according to claim 1, wherein widths of each of the plurality of electrode fingers are the same or substantially the same, where the widths are dimensions of the plurality of electrode fingers in the acoustic wave propagation direction.

16. The acoustic wave device according to claim 1, wherein a gap is provided between each of the plurality of electrode fingers other than the at least one of the plurality of electrode fingers connected to the first busbar and the second busbar and one of the first busbar and the second busbar.

17. The acoustic wave device according to claim 1, wherein each of the first and second reflectors includes a mass addition film.

18. The acoustic wave device according to claim 1, wherein the at least one of the plurality of electrode fingers connected to the first busbar and the second busbar includes only one of the plurality of the electrode fingers located at one end portion of the reflector.

19. A duplexer comprising:
    a transmitting filter; and
    a receiving filter having a passband different from a passband of the transmitting filter; wherein
    the transmitting filter includes series arm resonators and parallel arm resonators;
    at least one of the series arm resonators and the parallel arm resonators is defined by the acoustic wave device according to claim 1.

* * * * *